United States Patent [19]
Cavaliere et al.

[11] 3,961,254
[45] June 1, 1976

[54] TESTING EMBEDDED ARRAYS

[75] Inventors: Joseph R. Cavaliere; Rocco Robortaccio, both of Hopewell Junction, N.Y.

[73] Assignee: International Business Machines Corporation, Armonk, N.Y.

[22] Filed: Dec. 20, 1974

[21] Appl. No.: 534,608

[52] U.S. Cl. .................. 324/73 AT; 235/153 AC; 235/153 AK
[51] Int. Cl.² ........................................ G01R 15/12
[58] Field of Search .................. 324/73, 51, 158 R; 235/153 AC, 153 AK, 153 AM; 340/174 ED

[56] References Cited
UNITED STATES PATENTS
3,387,276  6/1968  Reichow ................. 235/153 AK
3,758,761  9/1973  Henrion ................. 235/153 AK Primary Examiner—R. V. Rolinec
Assistant Examiner—Michael J. Tokar
Attorney, Agent, or Firm—Joseph L. Spiegel

[57] ABSTRACT

An LSI semiconductor device includes a memory array incorporating address, data and buffer registers, and associated combinatorial and/or sequential logic circuitry. The array is "embedded" in the sense that the memory array is not directly accessible, either in whole or in part, from the input and output terminals or pads of the device. To facilitate testing, means which bypass the associated logic circuitry are provided for scanning information directly into the address and data registers. The information so introduced is shifted through the register strings. The interconnections from the associated logic circuitry are inhibited during the testing mode while the information shifting means are inhibited during an operative mode. The information scanned into the registers may be scanned out to determine whether there is a defect or problem in the register strings. Output levels from the array are compared with an expected output.

7 Claims, 4 Drawing Figures

TESTING EMBEDDED ARRAYS

BACKGROUND OF THE INVENTION

1. Field of the Invention

This invention relates semiconductor devices so designed and arranged as to facilitate the testing of same. While not so limited the invention is primarily concerned with large scale integrated (LSI) chip or semiconductor devices having memory arrays and similar devices embedded therein, the array incorporating address, data and buffer registers.

For purposes of discussion the term "embedded" is defined as that condition of a memory array, circuit element or even a circuit function on an LSI chip, when surrounded by other circuitry on the chip, such that the memory array, circuit element or circuit function is not directly accessible, either in whole or in part, from the input and output terminals or pads of the chip.

A prime problem associated with such devices is the testing of the embedded array and, in particular, in getting the proper test data and address words to the array inputs. When there is a substantial amount of logic surrounding the array the problem is determining what input pattern or sequence of input patterns, if any, can be applied to the primary inputs of the device in order to get the correct pattern at the array, and, thereafter, to obtain meaningful test data results from the device output.

With the advent of large scale integration, the circuit designer as well as the component manufacturer are provided with the ability to increase greatly the number of circuits on a single chip of semiconductor material. But unless some means is provided for permitting testing of circuitry embedded within the chip, further increases in circuit density can not be expected.

2. Description of the Prior Art

Of course, the problem of testing LSI chips has been addressed before. One example, is the level sensitive testing technique of E. B. Eichelberger, U.S. Pat. No. 3,761,695 issued Sept. 25, 1973, and assigned to the same assignee as the present invention. M. T. McMahon, Jr., U.S. Pat. No. 3,781,670 issued Dec. 25, 1973, and assigned to the same assignee as the present invention allows a.c. performance testing of an LSI chip during fabrication. R. L. James, U.S. Pat. No. 3,789,205 issued Jan. 29, 1974, and assigned to the same assignee as the present invention, teaches testing individual chips mounted on a planar board while the chips are interconnected so as to perform a desired logical function by electronically isolating the chips and applying test patterns to the input lines of the chips to be tested. R. L. James, U.S. Pat. 3,790,885 issued Feb. 5, 1974, and assigned to the same assignee as the present invention, describes a method of testing LSI chips which comprises adding to the chip device, shift register storage means, loading a test pattern into the shift register storage means, applying the test pattern to selected elements of the chip device and monitoring the results.

Still other techniques addressing the problem of testing LSI chips are disclosed in: T. H. Baker, et al., U.S. Pat. No. 3,762,027 issued Oct. 2, 1973, and assigned to the same assignee as the present invention; and, De-Wolf, U.S. Pat. No. 3,772,595, issued Nov. 13, 1973.

None of the above, however, provide a solution for the testing of embedded arrays.

SUMMARY OF THE INVENTION

An object of the invention is an LSI semiconductor device of high circuit density.

Another object is such a device allowing testing of memory arrays and the like embedded within said device.

Still another object is such a device that allows array testing using conventional memory test equipment.

A further object is fabrication of LSI semiconductor devices in such manner as to facilitate testing.

These and other objects are accomplished in accordance with the present invention, one illustrative embodiment of which comprises by-passing the associated interfacing logic circuitry to the memory array of an LSI chip or semiconductor device incorporating address, data and buffer registers, which array is embedded by reason of its being surrounded by the associated logic circuitry between it and the primary access points to the device. This by-passing permits scanning information directly into the address and data registers. The information so introduced may be shifted through the register strings. The interconnections from the associated logic circuitry is inhibited during the testing mode while the information shifting means is inhibited during an operative mode. The information scanned into the registers may be scanned out to determine whether there is a defect or problem in the register strings. Output levels from the array are compared with an expected output.

BRIEF DESCRIPTION OF THE DRAWING

The foregoing and other objects, features and advantages of the invention will be apparent from the following, more particular description of the present invention, as illustrated in the accompanying drawing, wherein.

DESCRIPTION OF THE PREFERRED EMBODIMENTS

Figure 1:
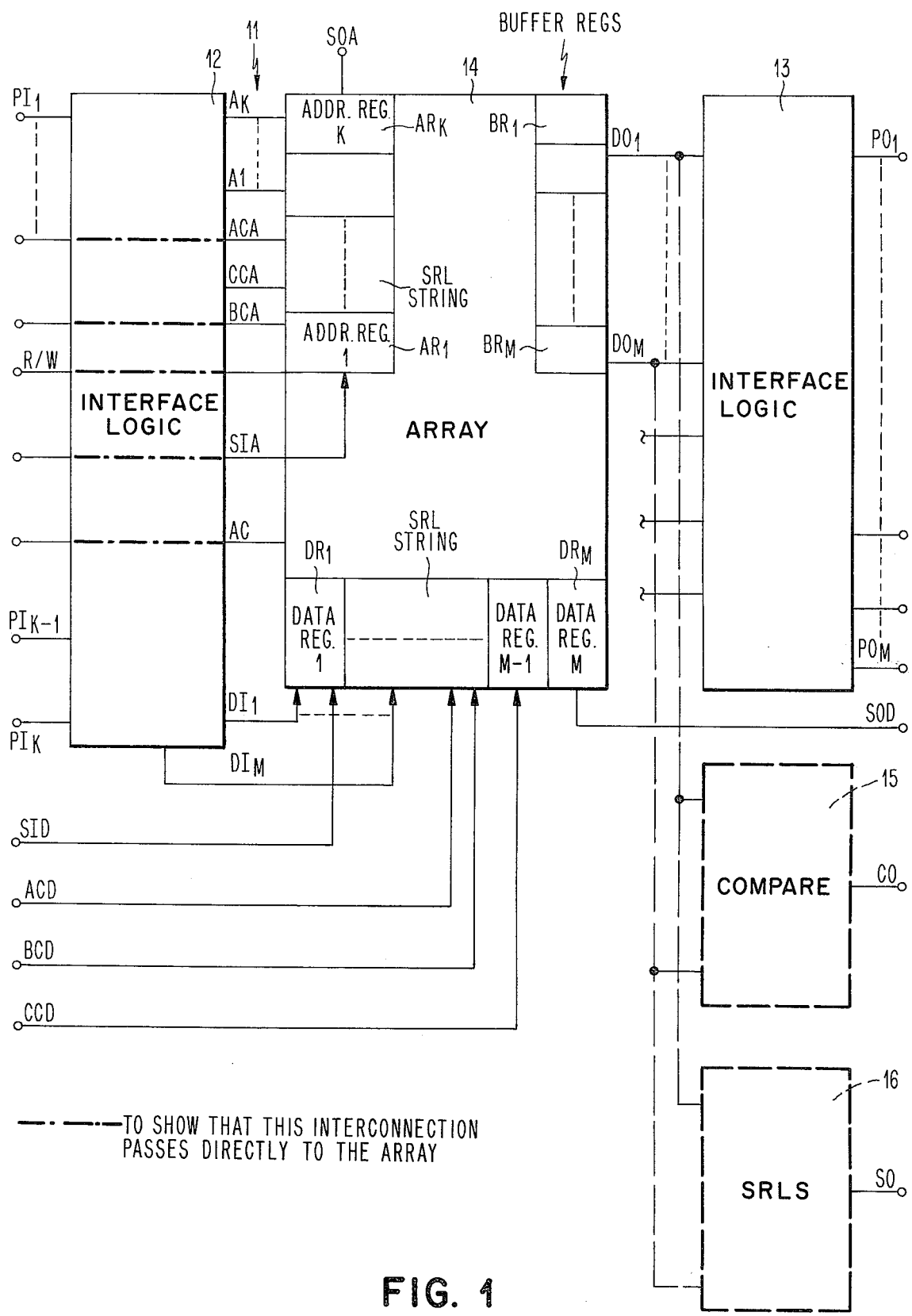
FIG. 1 is a simplified block diagram of an LSI chip or semiconductor device in accordance with the teachings of the present invention.

Referring now to FIG. 1 there is illustrated in simple, block diagram form an LSI chip or semiconductor device 11 in accordance with the teachings of the present invention.

Chip 11 typically includes a plurality of combinatorial and/or sequential interfacing logic circuits 12, 13 and a memory array 14.

Connections or lead lines from primary chip inputs to logic circuitry 12 are generally designated by the reference numerals PI1...PIK. They extend only to the circuitry 12 and are not seen directly by the array 14. In a more general case, there would be logic connections between interface logic circuitry 12 and interface logic circuitry 13, primary inputs to interface logic circuitry 13, primary outputs from interface logic circuitry 12, and interconnections between the interface logic circuitry and other circuitry on the chip (not shown).

The memory array 14 may typically be 64 × 8, meaning 64 addresses each 8 bits. The invention is not size limited, however, and is applicable to either smaller or larger arrays as well. Moreover, the invention is applicable to different type arrays such as read-only stores (ROS) and random access memory (RAM) arrays.

The array 14 typically includes: a string of shift register latches functioning as address registers and designated AR1...ARK; a string of shift register latches as data registers and designated DR1...DRM; and a group of latches as buffer registers and designated BR1...BRM.

In an operative or a test mode the address registers AR1...ARK store the address of the location within the array to be used.

Interconnections between logic circuitry 12 and address registers AR1...ARK are designated A1...AK; interconnections between logic circuitry 12 and data registers DR1...DRM; are designated DI1...DIM; and, interconnections between buffer registers BR1...BRM and logic circuitry 13 are designated DO1...DOM.

Connections or lead lines from logic circuitry 13 to primary chip outputs are designated PO1...POM.

A read-write line R/W extends from a chip primary input directly to the array for instructing the array to perform either a read or write operation. A clock line AC extends from a primary input to the array 14 for providing a series of timed pulses to the array, allowing the array to be performed. In a more general case the read/write and clock lines can be fed to the array through combinatorial logic.

The device 11 as thus far described is characteristic of the prior art in that the device incorporates an embedded array 14. Thus, for example, lead lines PI1...PIK extend from primary inputs to interface logic circuitry 12, lead lines PO1...POM extend from interface logic circuitry 13 to the primary outputs, while interconnections A1...AK, DI1...DIM and DO1...DOM extend between the logic circuitry 12, 13 and the array 14. But the memory array 14 is not directly accessible from the primary inputs and outputs of the device 11 due to the intervening interface logic circuitry 12, 13.

To overcome this and in accordance with the teachings of the present invention advantage is taken of the fact that this particular type of array 14 already includes strings of shift register latches functioning as address registers AR1...ARK and data registers DR1...DRM. During actual system operation these registers store bits of information as the chip designer intends.

For testing purposes however, and in accordance with the teachings of the present invention there is provided: means (SIA AND SID) for introducing information into the address register string AR1...ARK and data register string DR1...DRM, respectively, directly from primary inputs; means (ACA & BCA, ACD & BCD) for shifting information introduced into the address and data register strings, respectively, through the register strings; means (CCA & CCD) for inhibiting the information shifting means when the device is in an operative mode and for inhibiting the interconnections (A1...AK and DI1...DIM) from the interface logic 12 when the device is in a test mode; means (SOA and SOD) for scanning out information introduced directly into the register string (AR1...ARK and DR1 and DRM) from the primary inputs; means 15 connected to the buffer registers BR1...BRM for comparing the test out with an expected output; means CO for monitoring the output level of the compare network; a string 16 of shift register latches for obtaining the out-of-phase outputs from the memory array 14 during testing mode; and, means SO for monitoring the output of the string 16.

In an operative mode information from the interface logic circuitry 12 is loaded into the address registers AR1...ARK via interconnections A1...AK. But in the test mode interface logic circuitry 12 is bypassed and the address to be located is scanned in directly to the address registers AR1...ARK from primary inputs via scan-in line SIA.

Figure 2:
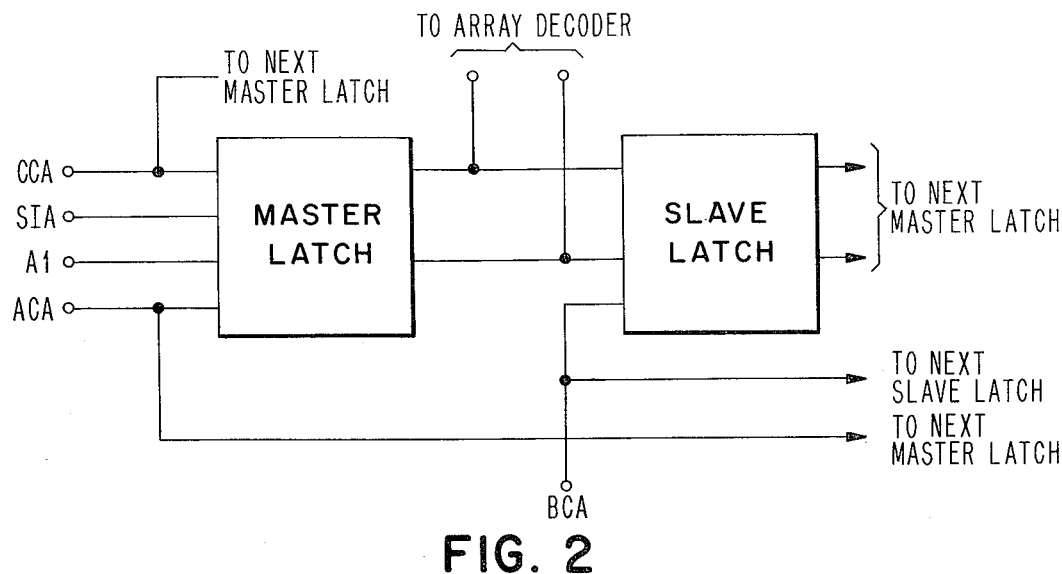
FIG. 2 is a simplified block diagram of a typical shift register latch used in the embedded array of FIG. 1.

The first bit of information will be scanned into the first register AR1 via line SIA. Each address register AR1...ARK has two latches as best shown in FIG. 2 a master latch and a slave latch. The master input latch of each register is controlled by clock line ACA and the slave output latch which is connected to the input of the next register is controlled by clock line BCA.

Figure 3:
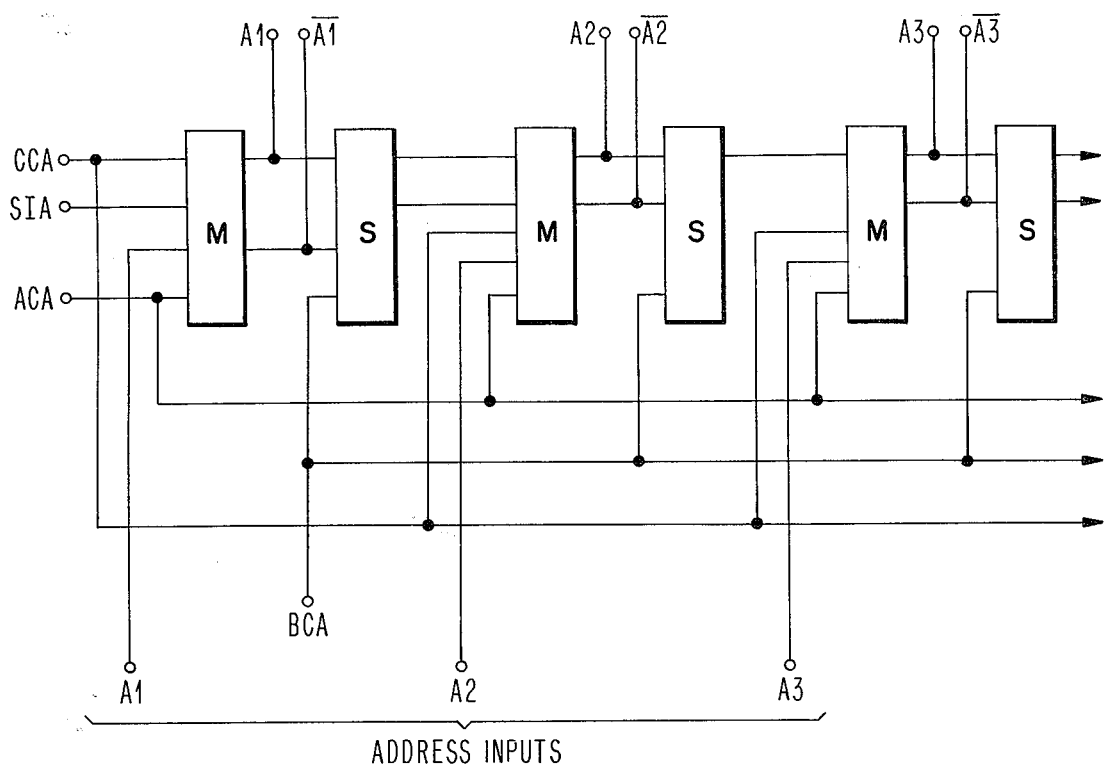
FIG. 3 is a simplified block diagram of the SRL string of address registers of the array of FIG. 1; and, FIG. 4 is a simplified block diagram of the test output portion of the device of FIG. 1.

As best shown in FIG. 3 by successively pulsing from line ACA and then BCA, bits of information scanned into the first register AR1 via line SIA are shifted into the next register AR2, then the next register AR3, etc. There can be a constant shifting of information from one register to the next by means of the clock lines ACA and BCA.

It is seen that information may be loaded into the address registers AR1...ARK from either the scan-in line SIA or the interconnecting lines A1...AK. In the operative mode the clock line CCA acts to inhibit the clock line ACA and BCA so that information can be loaded into the address registers AR1...ARK from the interface logic 12. But in the test mode clock line CCA inhibits line A1...AK to allow information to be scanned into the registers AR1...ARK via scan-in line SIA.

In the test mode the address information that is initially scanned into the address registers AR1...ARK via scan-in line SIA may be scanned out via scan-out line SOA. If the address information scanned out differed from the address information scanned in this would indicate that there was a defect or problem in the address register string AR1...ARK.

The arrangement and operation of the data registers DR1...DRM are essentially the same as at the address registers AR1...ARK. In an operative mode information from the interface logic circuitry 12 is loaded into the data registers DR1...DRM via interconnections DI1...DIM. In the test mode the interface logic circuitry 12 is bypassed and data is scanned in directly to the data register DR1...DRM from primary inputs via scan-in line SID.

The first bit of information will be scanned into the first data register via line SID. By successively pulsing from line ACD and then BCD data scanned into the first register DR1 is shifted into the next register DR2, then the next register DR3, etc. There can be a constant shifting of information from one data register to the next by means of the clock lines ACD and BCD.

In the operative mode the clock line CCD acts to inhibit the clock lines ACD and BCD so that data can be loaded into the data registers DR1...DRM from the interface logic circuitry 12. But in the test mode clock line CCD inhibits lines DI1...DIM to allow data to be scanned into the data registers DR1...DRM via scan-in line SID.

In the test mode the data information that is initially scanned into the data registers DR1...DRM via scan-in line SID may be scanned out via scan-out line SOD. If the data information scanned out differed from the data information scanned in, this would indicate that there was a defect or problem in the data register string DR1...DRM.

The invention will be further illustrated by explaining its operation through one test cycle. The clock line CCA inhibits the interconnecting lines A1...AK. A certain address is scanned into the address registers AR1...ARK via scan-in line SIA and shifted from register to register by successive pulsing of clock lines BCA and CCA. If only the address registers are being checked the address that was scanned in via scan-in line SIA is scanned out via scan-out line SOA and the output compared with the input. If they match then the address registers are operating properly. A similar sequence of steps is repeated for testing the data registers DR1...DRM.

Figure 4:
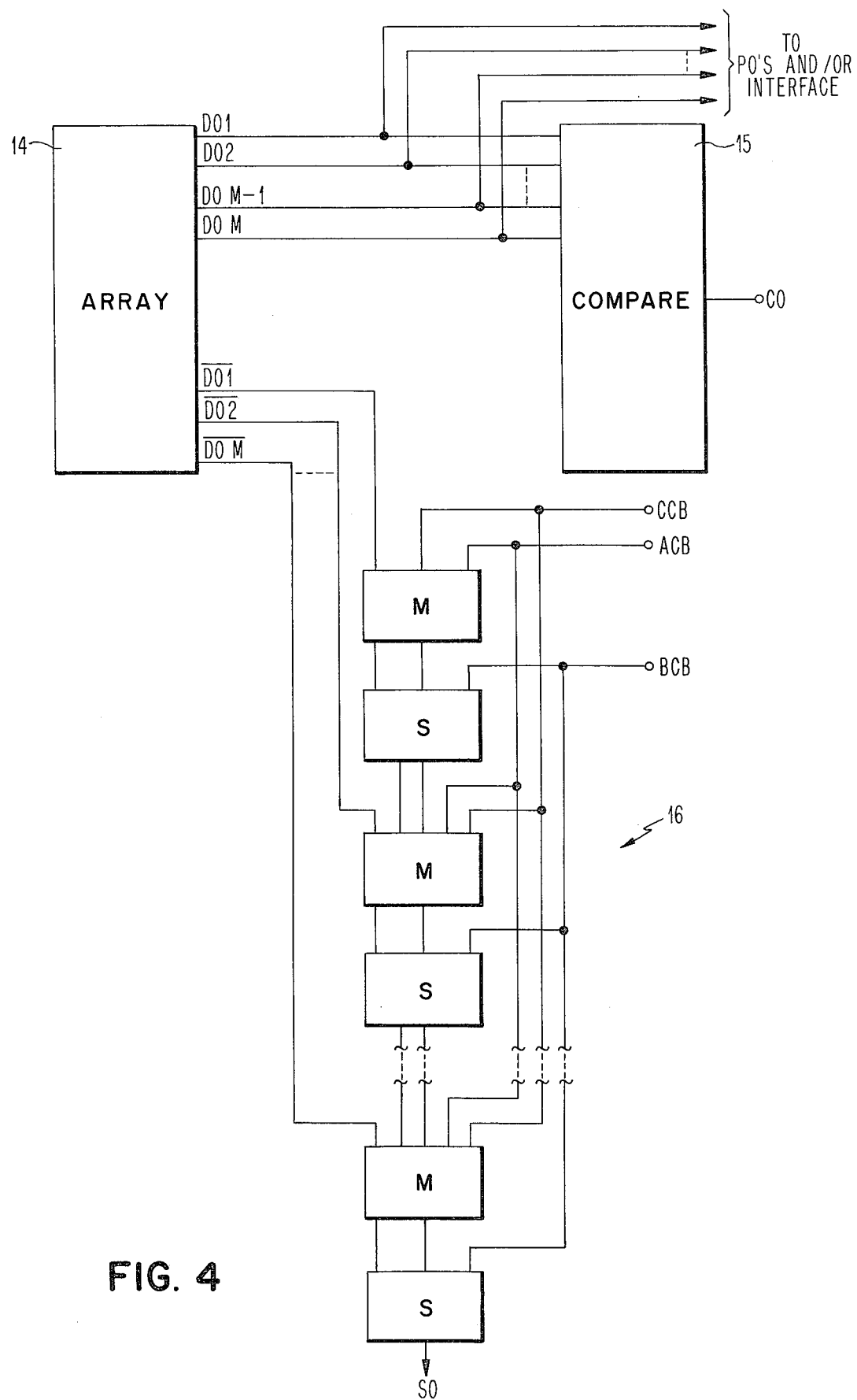

Following this the array itself is tested and this is done simply by operating the array in the usual manner to read what was put in. With reference now to both FIG. 1 and FIG. 4, the output from the buffer registers BR1...BRM is fed to compare circuit 15 and there compared with an expected output. The output at CO from the compare circuit, for example, will either be a 0 or a 1 depending on how the compare network output has been designated for a predetermined test pattern.

A further advantage is that the out-of-phase output from the array 14 (see FIG. 4) can be fed to the string 16 of register latches and shift out the information where it can be monitored at the line SO leading to an output pad. Clock lines ACB and BCB act to shift information through the string while clock line CCB acts to inhibit in the same manner as, for example, clock lines ACA, BCA and CCA with respect to the address registers AR1...ARK.

This testing technique does not result in any surrounding logic or array performance degradation that might be caused by the introduction of additional logic circuitry and another delay.

A further advantage of the invention is that once the array has been tested the array itself may be used to test the remaining logic on the LSI device.

A further advantage to this invention is that of burst mode testing. For example, with the array in test mode one can scan-in an address to be located directly into the address registers AR1...ARK. One can also have the new address data sitting at the interconnecting A1...AK. Then one operates the array interrogate the address that had been scanned in then store the address on the lines A1...AK in the address registers AR1...ARK and operate the array again and interrogate the address put in the address registers from the interconnecting lines A1...AK. One would adopt this procedure where one might reasonably expect the sequence of events to cause a failure or to test for the response time of the array.

Thus, while the invention has been particularly shown and described with reference to the preferred embodiment thereof, it will be understood by those skilled in the art that the various changes in the form and detail and omissions may be made without departing from the spirit and scope of the invention.

What is claimed is:

1. In an LSI semiconductor device comprising a memory array, including address, data and buffer registers, associated logic circuitry and primary access points to and from external circuitry, operatively associated and so arranged as to provide no direct access from said primary access points to all portions of said memory array, the improvement comprising:
 means bypassing said associated logic circuitry for loading a test pattern into one of said address and data registers directly from primary access points; and,
 means bypassing said associated logic circuitry for testing the output of said memory array.

2. The invention defined by claim 1 including means for shifting the test pattern introduced into one of said address and data registers and means for scanning out the test pattern introduced into one of said address and data registers.

3. The invention defined by claim 2 including means for inhibiting said shifting means when said device is in an operative mode and for inhibiting access between said logic circuitry and said memory array when said device is in a test mode.

4. The invention defined by claim 1 wherein said test means includes a compare network for comparing said memory array test output with predetermined expected outputs.

5. The invention defined by claim 1 wherein said test means includes a string of shift register latches for monitoring the out-of-phase output from said memory array.

6. In the method of testing an LSI semi-conductor device that includes logic circuitry, a memory array including address data and buffer registers and primary access points to and from external circuitry, operatively associated and so arranged as to provide no direct access from said primary access points to portions of said memory array, the improvement which comprises:
 bypassing said associated logic circuitry;
 loading a test pattern into one of said address and data registers directly from said primary access points;
 performing the array; and,
 testing the output of said memory array.

7. The invention defined by claim 6 including loading a test pattern into said one of said address and data registers from said operatively associated logic circuitry after performing the array, and performing the array after a second time and then testing the output of said array.

* * * * *